United States Patent
Gopalan

(10) Patent No.: US 9,584,309 B2
(45) Date of Patent: *Feb. 28, 2017

(54) CIRCUIT FOR DYNAMICALLY ADAPTIVE BIT-LEVELING BY INCREMENTAL SAMPLING, JITTER DETECTION, AND EXCEPTION HANDLING

(71) Applicant: UNIQUIFY, INC., San Jose, CA (US)

(72) Inventor: Mahesh Gopalan, Milpitas, CA (US)

(73) Assignee: Uniquify, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/078,939

(22) Filed: Mar. 23, 2016

(65) Prior Publication Data

US 2016/0254903 A1 Sep. 1, 2016

Related U.S. Application Data

(63) Continuation of application No. 14/273,416, filed on May 8, 2014, now Pat. No. 9,300,443, which is a
(Continued)

(51) Int. Cl.
*H04L 7/033* (2006.01)
*G06F 11/07* (2006.01)
(Continued)

(52) U.S. Cl.
CPC .............. *H04L 7/0337* (2013.01); *G06F 1/08* (2013.01); *G06F 11/0763* (2013.01);
(Continued)

(58) Field of Classification Search
CPC .... G06F 11/0763; G06F 1/08; G06F 11/0793; H04L 1/205; H03K 5/00; H03K 19/01806
See application file for complete search history.

(56) References Cited

U.S. PATENT DOCUMENTS 5,157,530 A 10/1992 Loeb et al.
6,434,081 B1 8/2002 Johnson et al.
(Continued)

FOREIGN PATENT DOCUMENTS

WO WO2012145117 10/2012

OTHER PUBLICATIONS

Krishnan, et al., "Reducing Timing Jitter in UWB-IR Threshold Detectors," Proceedings of 2010 IEEE International Conference on Ultra-Wideband (vol. 1), pp. 1-4, (Sep. 20-23, 2010).*

(Continued)

*Primary Examiner* — Albert Decady
*Assistant Examiner* — Kyle Vallecillo
(74) *Attorney, Agent, or Firm* — Cherskov Flaynik & Gurda, LLC

(57) ABSTRACT

A circuit and method for implementing an adaptive bit-leveling function in an integrated circuit interface is disclosed. During a calibration operation, a pre-loaded data bit pattern is continuously sent from a sending device and is continuously read from an external bus by a receiving device. A programmable delay line both advances and delays each individual data bit relative to a sampling point in time, and delay counts relative to a reference point in time are recorded for different sampled data bit values, enabling a delay to be determined that best samples a data bit at its midpoint. During the advancing and delaying of a data bit, jitter on the data bit signal may cause an ambiguity in the determination of the midpoint, and solutions are disclosed for detecting jitter and for resolving a midpoint for sampling a data bit even in the presence of the jitter.

12 Claims, 13 Drawing Sheets

Related U.S. Application Data continuation of application No. 13/797,200, filed on Mar. 12, 2013, now abandoned.

(51) Int. Cl.
*G06F 1/08* (2006.01)
*H04L 1/20* (2006.01)
*H03K 5/00* (2006.01)
*H03K 19/018* (2006.01)

(52) U.S. Cl.
CPC ........ *G06F 11/0793* (2013.01); *H03K 5/00* (2013.01); *H03K 19/01806* (2013.01); *H04L 1/205* (2013.01)

(56) References Cited

U.S. PATENT DOCUMENTS

| | | |
|---|---|---|
| 6,442,102 B1 | 8/2002 | Borkenhagen et al. |
| 6,510,503 B2 | 1/2003 | Gillingham et al. |
| 6,788,124 B1 | 9/2004 | Kaviani |
| 7,042,296 B2 | 5/2006 | Hui et al. |
| 7,043,652 B2 | 5/2006 | Matsui |
| 7,054,401 B2 | 5/2006 | Kada et al. |
| 7,123,051 B1 | 10/2006 | Lee et al. |
| 7,171,321 B2 | 1/2007 | Best |
| 7,209,531 B1 | 4/2007 | Katz et al. |
| 7,215,584 B2 | 5/2007 | Butt et al. |
| 7,240,249 B2 | 7/2007 | Buchmann et al. |
| 7,366,862 B2 | 4/2008 | Nystuen et al. |
| 7,405,984 B2 | 7/2008 | Hughes |
| 7,441,139 B2 | 10/2008 | Kuwata |
| 7,454,303 B2 | 11/2008 | Magee et al. |
| 7,509,223 B2 | 3/2009 | Chong et al. |
| 7,543,172 B2 | 6/2009 | Kizer et al. |
| 7,571,396 B2 | 8/2009 | Hughes et al. |
| 7,647,467 B1 | 1/2010 | Hutsell |
| 7,724,606 B2 | 5/2010 | Osawa et al. |
| 7,755,402 B1 | 7/2010 | Ku et al. |
| 7,818,528 B2 | 10/2010 | Hughes |
| 7,924,637 B2 | 4/2011 | Searles et al. |
| 7,957,218 B2 | 6/2011 | Welker |
| 7,965,212 B1 | 6/2011 | Turner |
| 7,975,164 B2 | 7/2011 | Lee et al. |
| 8,134,878 B1 | 3/2012 | Shimanek et al. |
| 8,139,430 B2 | 3/2012 | Buchmann et al. |
| 8,151,133 B2 | 4/2012 | Kizer et al. |
| 8,588,014 B1 | 11/2013 | Fung et al. |
| 2003/0154416 A1 | 8/2003 | LaBerge |
| 2004/0123207 A1 | 6/2004 | Zumkehr et al. |
| 2005/0005056 A1 | 1/2005 | Ware |
| 2006/0107011 A1 | 5/2006 | Nystuen et al. |
| 2007/0097781 A1 | 5/2007 | Li et al. |
| 2007/0226529 A1 | 9/2007 | Huang |
| 2008/0005518 A1 | 1/2008 | Gillingham et al. |
| 2008/0068911 A1 | 3/2008 | Hughes et al. |
| 2008/0276133 A1 | 11/2008 | Hadley et al. |
| 2009/0006730 A1 | 1/2009 | Gara et al. |
| 2009/0125263 A1 | 5/2009 | Zurbuchen |
| 2009/0168563 A1 | 7/2009 | Jiang |
| 2009/0307521 A1 | 12/2009 | Lee et al. |
| 2010/0238747 A1 | 9/2010 | Chen et al. |
| 2010/0271094 A1 | 10/2010 | Hassan |
| 2010/0299644 A1 | 11/2010 | Kawai |
| 2011/0235459 A1 | 9/2011 | Ware |
| 2011/0249522 A1 | 10/2011 | Welker et al. |
| 2011/0258475 A1 | 10/2011 | Lee et al. |
| 2012/0063524 A1 | 3/2012 | Stott et al. |
| 2012/0106264 A1 | 5/2012 | Chong et al. |
| 2012/0170389 A1 | 7/2012 | Kizer et al. |
| 2012/0187993 A1 | 7/2012 | Kanno et al. |
| 2012/0218841 A1 | 8/2012 | Hunt |
| 2012/0243351 A1 | 9/2012 | Ota |
| 2014/0177359 A1* | 6/2014 | Kumar ............... G11C 7/1066 365/194 |

OTHER PUBLICATIONS

Application Note—High Performance DDR3 SDRAM interface in Virtex-5 Devices Xilinx Corporation—Sep. 27, 2007—p.10.
Application Note—Utilizing Leveling Techniques in DDR3 SDRAM Memory Interfaces Altera Corp—Nov. 2007—p. 2.
White Paper—The Love/Hate Relationship with DDR SDRAM Controllers Mosaid Technologies Inc.—Oct. 2006—pp. 7-8.
Everything Explained AT—CAS Latency Explained A. B. Cryer—2009-2011.
Lattice Seminconductor, "Implementing High-Speed DDR3 Memory Controllers in a Mid-Range FPGA".
Altera, "AN 552: Using DDR and DDR2 SDRAM in Arria II GX Devices".
Texas Instruments, "AM17x/AM18x ARM Microprocessor DDR2/mDDR Memory Controller".
Altera, "AN 436: Using DDR3 SDRAM in Stratix III and Stratix IV Devices".

* cited by examiner

800
Exception Processing
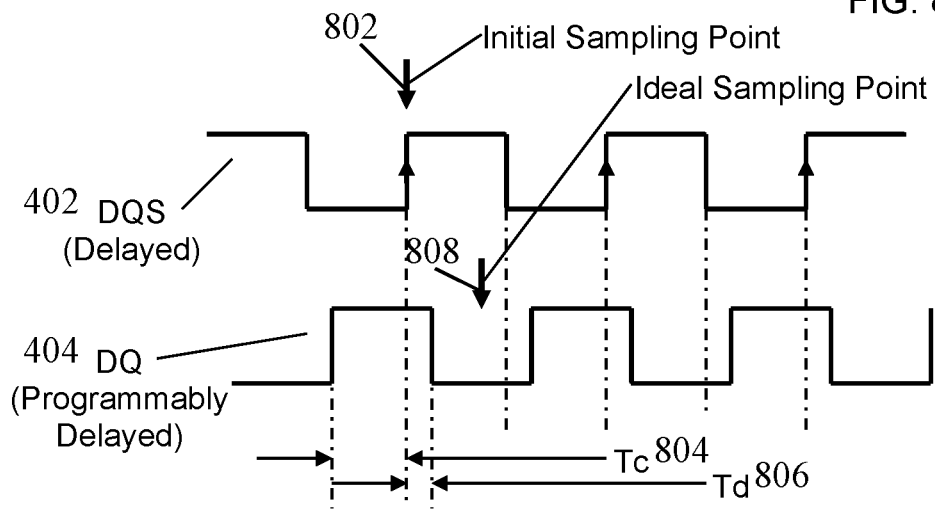
FIG. 8a
810  Tc > Td, from step 718 of FIG. 7    FIG. 8b
812
Advance DQ from the initial point until a 0 is detected (previously recorded as Td) and then a 1 is detected (record as Te).
814
Set the DQ delay line to advance DQ from the initial point by (Td+Te)/2.
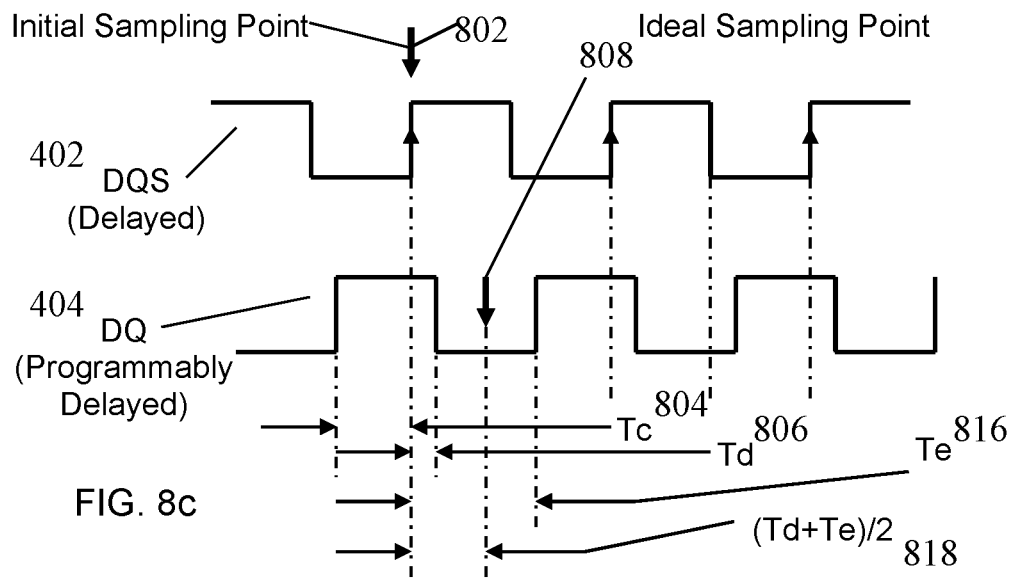
FIG. 8c
FIG. 8

900   Exception Processing
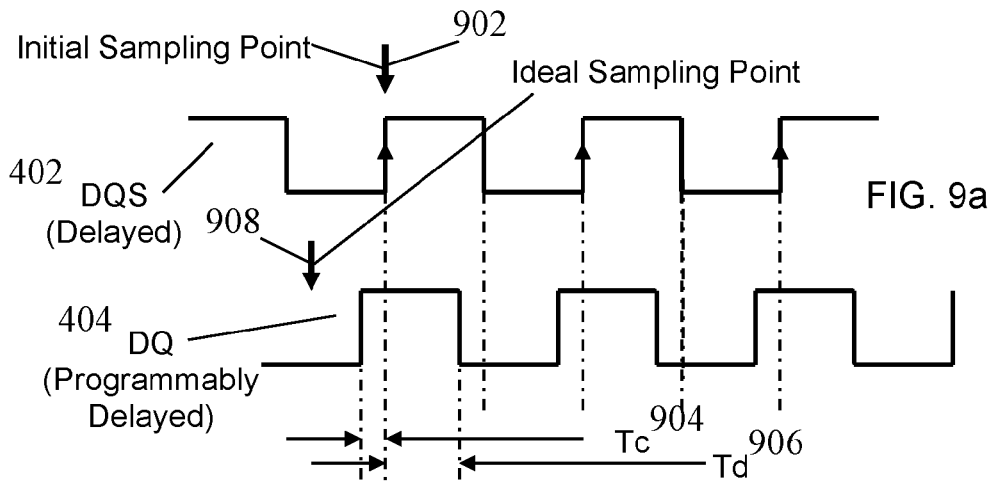
FIG. 9a
910  Tc < Td, from step 716 of FIG. 7
FIG. 9b
912  Delay DQ from the initial point until a 0 is detected (previously recorded as Tc) and then a 1 is detected (record as Tf).
914  Set the DQ delay line to delay DQ from the initial point by (Tc+Tf)/2.
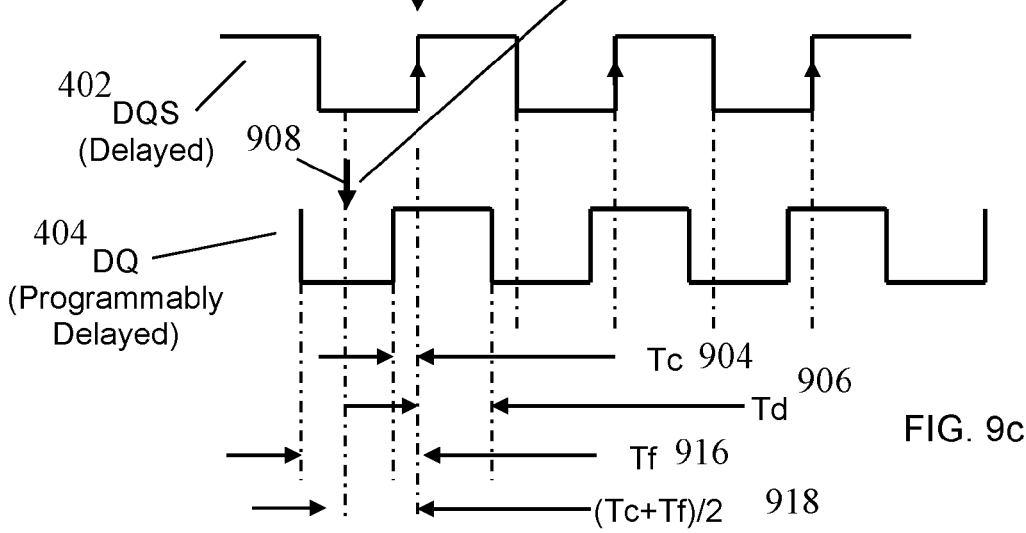
FIG. 9c
FIG. 9

1200 Sweep Sampling and Analysis

CIRCUIT FOR DYNAMICALLY ADAPTIVE BIT-LEVELING BY INCREMENTAL SAMPLING, JITTER DETECTION, AND EXCEPTION HANDLING

CROSS REFERENCE TO RELATED APPLICATIONS

This application claims the benefit as a continuation of U.S. Utility application Ser. No. 14/273,416, filed on May 8, 2014, presently pending, which in turn claimed the benefit of U.S. Utility application Ser. No. 13/797,200 filed on Mar. 12, 2013, currently abandoned, the contents of each of which are hereby incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates generally to interface circuits, typically implemented on integrated circuits such as Processor chips, memory controller chips, and SOC (System On Chip) integrated circuits where such interface are required. One common example of such an interface would receive data read from dynamic memory chips that are located externally to a device containing the receiving interface.

BACKGROUND

Given today's high clock rates and transmission line effects when signals must travel between integrated circuit chips, skew between different data bits in the same bus becomes a problem. As a system heats and cools during operation, and/or develops hot and cool spots, the skew between data bits can likewise change as data bit signals and strobe signals travel off chip and between chips through various system-level paths. Also, as these phenomenon dynamically change during operation, the skew between data bits can likewise change. Therefore, it would be useful to have a way to perform bit leveling from time to time during system operation, and to do so quickly, and to perform bit leveling independently for each data bit on a data bus.

One application where a dynamic bit leveling capability is especially useful for compensating for variable system-level delays is that of dynamic memory interfaces where DQ data bits can develop a skew problem with respect to the DQS strobe used to sample them. Jitter can also develop between data bits and strobes, and it would also be useful to resolve jitter issues while performing a bit-leveling function.

SUMMARY

A circuit and method for implementing a adaptive bit-leveling function in an integrated circuit interface is disclosed. During a calibration operation, a pre-loaded data bit pattern is continuously sent from a sending device and is continuously read from an external bus by a receiving data interface on a receiving device. In the receiving interface, a programmable delay line incrementally delays or advances each individual data bit relative to a sampling point in time, and delays are recorded for different sampled data bit values, enabling a delay to be determined that best samples a data bit at its midpoint. During the bit leveling calibration process and the advancing and/or delaying of a data bit, jitter on the data bit signal may cause an ambiguity in the determination of a data value midpoint, and solutions are disclosed for detecting jitter and for resolving a midpoint for sampling a data bit even in the presence of jitter.

To perform a calibration operation according to the invention a pattern of alternating "1s" and "0s" is read into a receiving data interface circuit and is processed according to the methods described herein. A strobe signal is delayed such that it will be nominally placed in the center of the delay line delay used to delay one or more data bit signals. As such, a particular data value, shown as a "0" for example in the description that follows, is expected when the strobe signal first samples a data bit signal. If the opposite value is recorded, according to a first embodiment of the invention this is considered an exception and is followed by special exception processing. When such an exception occurs, circuits and methods are disclosed that accommodate the exception and provide an optimum sampling point in time and the corresponding appropriate delay line delay for the sampled data bit.

In a first embodiment of the invention a programmable delay line for delaying the sampled data bit is used to both advance and delay the data bit in time relative to a sampling strobe. In the case of data coming from a dynamic memory, the sampled data bit would typically be a programmably delayed version of DQ, while the sampling strobe is a delayed version of DQS.

In a second embodiment of the invention, a programmable delay line for delaying the sampled data bit is used to incrementally sweep the delay of a sampled data bit in time relative to a sampling strobe, with sampled values recorded and/or analyzed at each increment, with an analysis also performed after completing the sweep to determine the best point in time to sample the data bit. The second embodiment may require a longer delay line for delaying the sampled data bit, additional time for the calibration operation, and additional controller storage capacity and control logic compared with the first embodiment. At the same time, the second embodiment includes an analysis process where criteria for analyzing strings of consecutive sampled data bits having the same value is performed such that jitter detection is performed at the same time, and there is no specific need for exception handling.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

FIG. 4a shows timing relationships before bit leveling and FIG. 4b shows timing relationships after bit leveling.

FIG. 8 shows diagrams describing timing relationships before and after exception processing plus a flow chart in FIG. 8b showing steps to complete exception processing under a first condition, where FIG. 8a shows timing relationships before bit leveling and FIG. 8c shows timing relationships after bit leveling.

FIG. 9 shows diagrams describing timing relationships before and after exception processing plus a flow chart in FIG. 9b showing steps to complete exception processing under a second condition, where FIG. 9a shows timing relationships before bit leveling and FIG. 9c shows timing relationships after bit leveling.

FIG. 12a shows timing relationships before bit leveling, FIG. 12b shows a jitter zone, and FIG. 12c shows timing relationships after bit leveling.

DETAILED DESCRIPTION

Figure 1A:
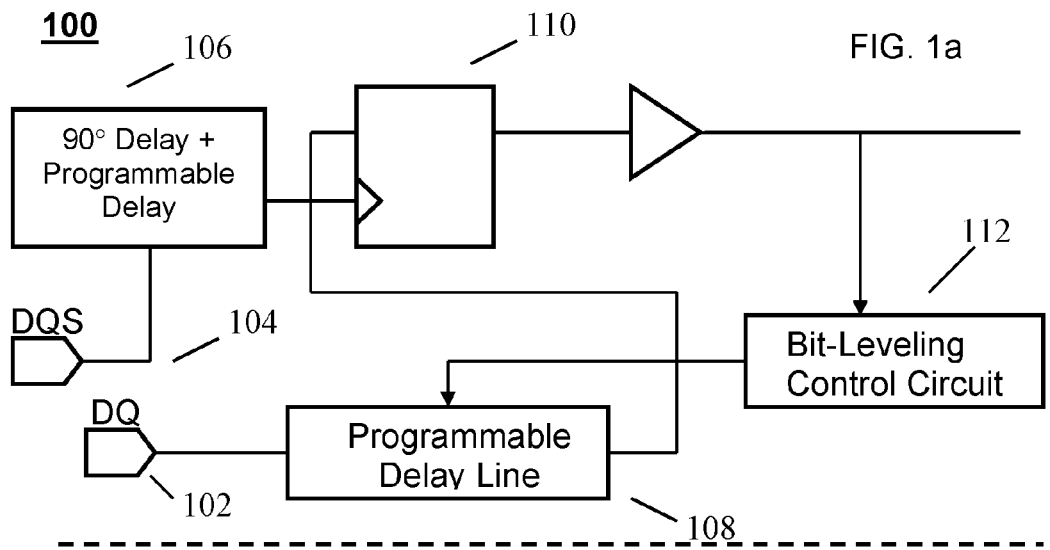
FIGS. 1A and 1B show exemplary and non-limiting embodiments for generalized circuit descriptions describing different aspects of the invention.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Bit leveling operations, according to the exemplary and non-limiting embodiments described herein, may be run at any time. However in some applications, bit leveling may be run after write leveling is performed and before a core clock capture synchronization operation is run when such a function is utilized. Examples of such core clock capture synchronization circuits and methods are described in U.S. Pat. No. 7,975,164 where such a function is termed SCL (Self-Configuring Logic), and also in US Patent Application Pub No 2011/0258475 where such a function is termed DSCL (Dynamic SCL).

Bit leveling according to the invention is able to be run dynamically at any point in time, preferably when the particular data interface is not being utilized such as for a dynamic memory data interface during a memory refresh operation. For the exemplary and non-limiting examples described herein for different embodiments of the invention, and in view of the fact that many common applications for the invention include dynamic memory controllers and data interfaces receiving data bits and strobes from dynamic memories, reference will typically be made to "DQ" for data bits being sampled and bit leveled, and to "DQS" as the corresponding sampling strobe. It should be understood however that the circuits and methods described herein are applicable to any data interface receiving data bits where skew and/or jitter develops and it is desirable to mitigate these problems in order to produce a more reliable data interface implementation.

To ensure that the rising edge of DQS is sampling the respective DQ data accurately, bit-leveling aligns the rising edge with the center of the DQ data bit value. This is done in order to compensate for the unpredictable amount of delay on DQ and DQS that results in an undesirable skew between the DQ and DQS signals. The algorithm is implemented by reading a continuous pattern of alternating 1s and 0s from the DRAM on DQ and DQS. The alternating pattern may be either "1-0-1-0" or "0-1-0-1", however for simplicity and consistency the pattern is described herein as 0-1-0-1. For exemplary embodiments described herein, DQS is typically delayed by 90 degrees to align sampling edges of DQS with centers of DQ data bits. Therefore ideally, the rising edge of DQS is always sampling a "0" on DQ. Prior to sampling, the DQ data bit is programmably delayed to allow advancing or delaying with respect to an edge of the DQS strobe. Therefore, in addition to the 90° delay of DQS mentioned above, DQS is additionally delayed by a programmable amount which is nominally equivalent to the amount DQ is initially programmably delayed. From this starting point, calibration processes determine further adjustment to the DQ the programmable delay line in order to place the center of each DQ data bit value in time aligned with the appropriate edge of the DQS strobe.

Figure 1B:
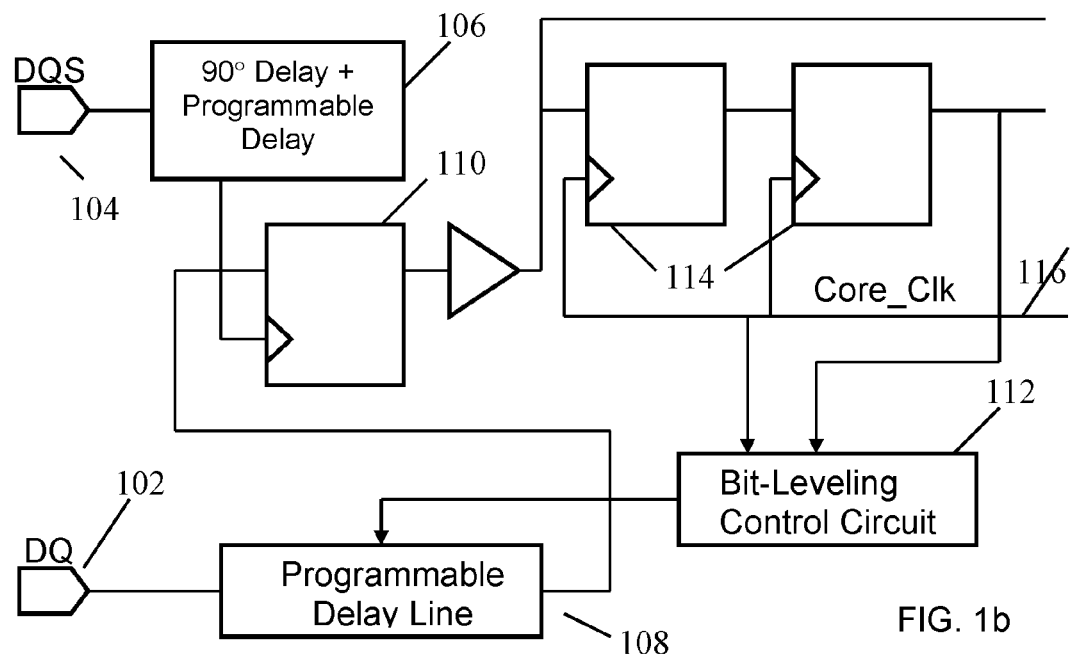

FIG. 1 shows two generalized circuit diagrams for data interfaces according to the invention. In FIG. 1a, data bit DQ 102 is programmably delayed in delay line 108 and thereafter is sampled at flip-flop 110 by a version of the DQS strobe 104 which has been delayed 106 by 90° to align its edge nominally with the center of a DQ data bit, and has also had a programmable delay added to position a delayed DQS strobe nominally centered relative to the delayed DQ data bit. FIG. 1a shows a more detailed exemplary implementation where bit leveling control circuit 112 is clocked by a core clock 116, and a buffered version of the output of flip-flop 110 is synchronized with the same core clock 116 by synchronizing flip-flops 114.

Figure 2:
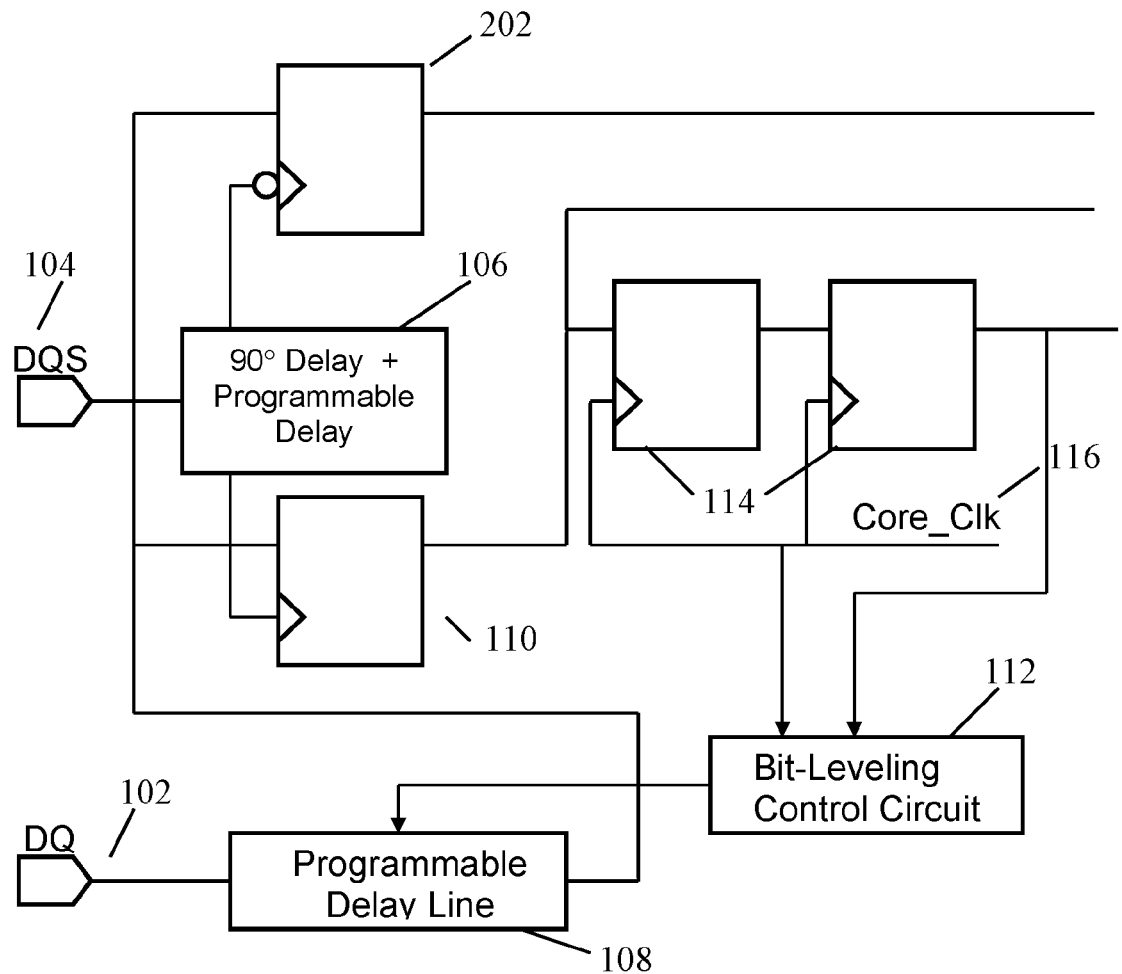
FIG. 2 shows an exemplary and non-limiting embodiment for a generalized circuit description describing aspects of the invention.

Exemplary implementations shown herein focus in general on synchronizing with the positive edge of the sampling strobe (flip-flop 110 is has a positive edge clock input), with the assumption that if bit leveling is performed relative to the positive edge of a sampling strobe such as DQS 104, the negative edge of such a sampling strobe will effectively align approximately in the center of the other half cycle of the data bit being sampled. FIG. 2 shows a more comprehensive example where the positive edge of DQS 104, having been delayed 106, samples delayed DQ data bit in flip-flop 110, while the negative edge of the delayed DQS strobe samples the same delayed DQ data bit in flip-flop 202. It should be noted that in another implementation, not shown, a similar bit leveling calibration and synchronization function can be applied such that bit leveling for the delayed DQ data bit relative to the negative edge of the delayed DQS strobe is also performed. This would typically require additional instances of bit leveling control circuit 112 and an additional programmable delay line for each DQ data bit being bit leveled.

In an example demonstrating one exemplary embodiment, bit-leveling operates by sampling DQ at the rising edge of DQS and then delays and advances DQ with respect to DQS so as to measure the distance (in delay line delay increments) to each edge of DQ. These distances, referred to as windows, are used to determine how far, or close, the rising edge of DQS is from the center of DQ and how much DQ needs to be delayed or advanced to center it. The example of FIGS. 3 and 4 demonstrate a scenario where DQ is being sampled too early, and the bit-leveling process therefore determines that a delay of (Ta−Tb)/2 QUOTE is to be added to DQ to align the center of a DQ data bit "0" value as close as possible with the rising edge of DQS.

In general, by determining the size of these delay measurement windows, the bit leveling process determines if DQ is being sampled too early or too late, and therefore adjusts the delay on DQ to sample it correctly.

Figure 3:
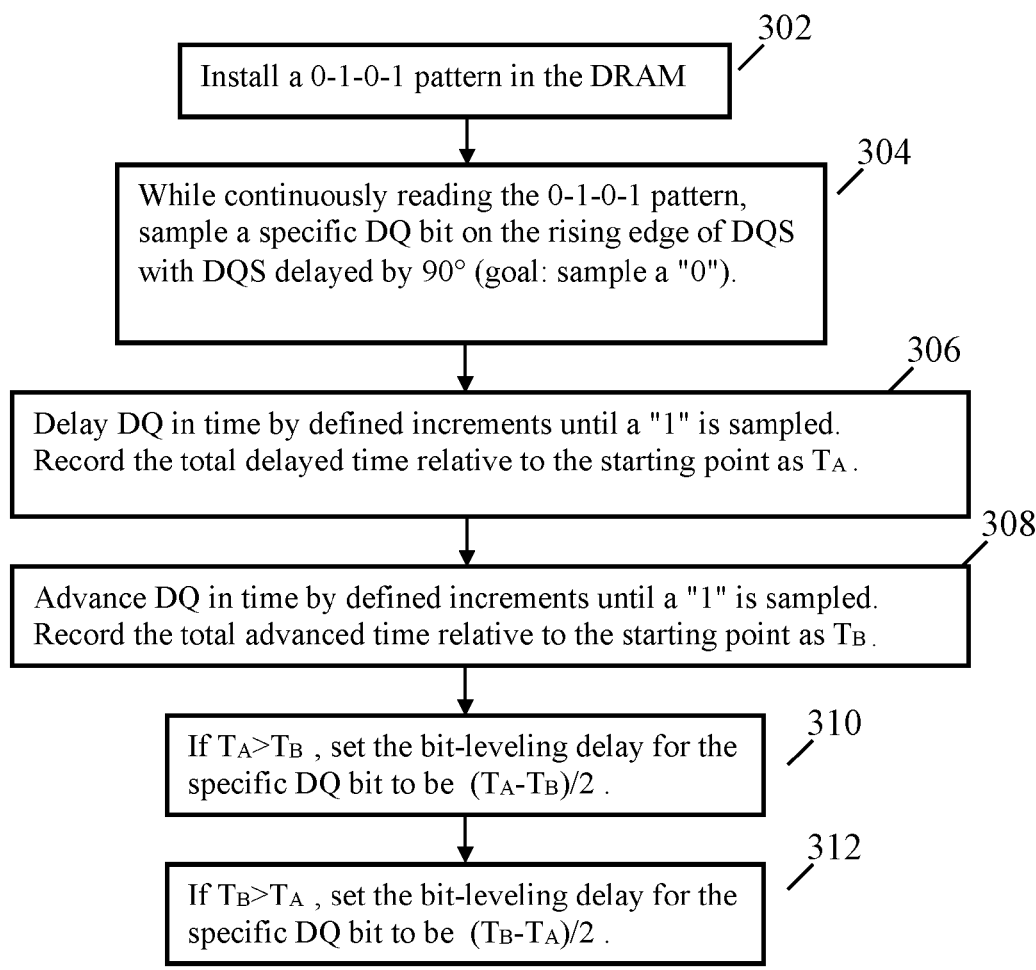
FIG. 3 shows an exemplary flowchart for bit leveling according to the invention where an expected data value is initially sampled, and where no exception processing or jitter detection is required.

An exemplary flowchart 300 for this process is shown in FIG. 3. In step 302, a 0-1-0-1 pattern is installed such that it can be received by a data interface according to the invention during a calibration operation. In this example, such a pattern is installed in a DRAM. According to step 304 while continuously receiving the 0-1-0-1 pattern, a programmably delayed version of a DQ data bit is sampled on the rising edge of DQS—where DQS has been delayed by 90° plus a suitable programmable delay as described previously. It is expected that given the data pattern received for this scenario, that when first sampled, a value of "0" will be sampled given the initial setting of the DQ programmable delay line. In an alternate embodiment, a value of "1" might instead be the expected value. Per step 306, from the initial delay line setting for DQ, DQ is subsequently delayed in time by some number of delay line increments until a "1" is sampled, and the total number of delay line increments required to achieve this point is recorded relative to the initial setting as Ta. Per step 308, DQ is advanced in time by incrementally adjusting the programmable delay line for DQ until a "1" is sampled, and the total number of increments advanced relative to the initial delay line setting is recorded as Tb. Subsequently per step 310, if Ta is greater than Tb, bit leveling is achieved by setting the programmable delay line delay value for DQ to be a delay value of (Ta−Tb)/2 from the initial sampling point. If however per step 312, Tb is greater than Ta, bit leveling is achieved by setting the programmable delay line delay value for DQ to be an advance value of (Tb−Ta)/2 from the initial sampling point. If Ta is equal to Tb, then the strobe is centered within the data bit value for DQ, and no further adjustment beyond the initial setting of the delay line is required to achieve bit leveling.

It should be noted that diagram 300 of FIG. 3 shows a simplified flow where when first sampled, the expected value is recorded as such no exception processing is required. Diagram 300 also includes no detection or compensation for jitter.

Figure 4:
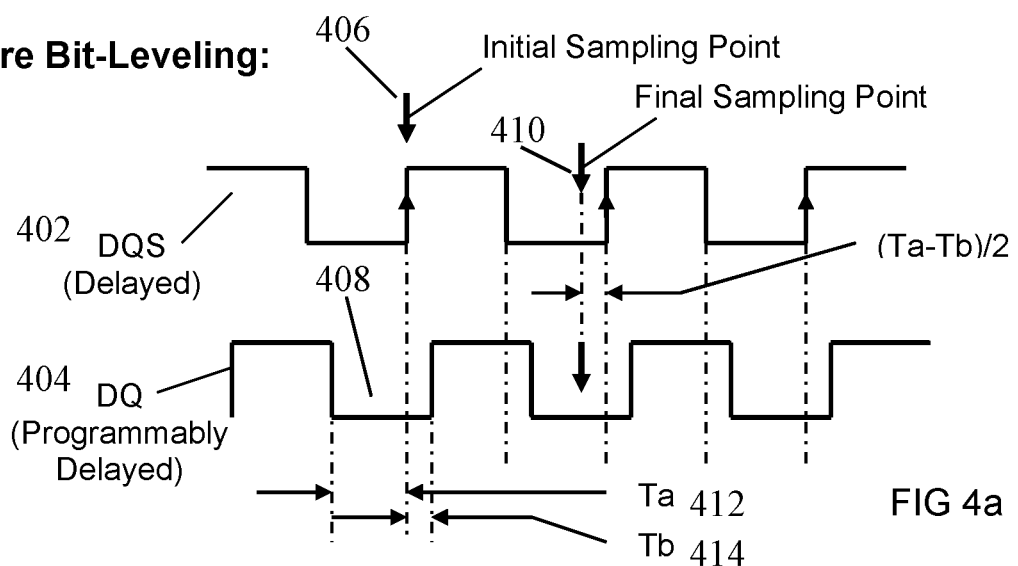
FIG. 4 shows exemplary timing diagrams for bit leveling in accordance with the flowchart of FIG. 3, where
Figure 4:
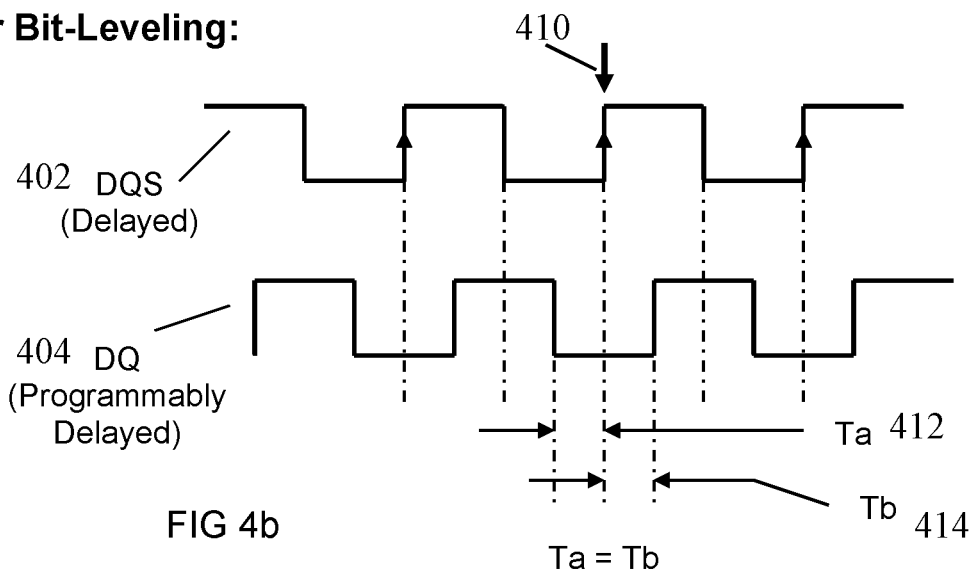

Timing diagrams 400 for the scenario of FIG. 3 are shown in FIG. 4. Here, FIG. 4a shows the timing relationship between the DQS strobe 402 and the programmably delayed DQ data bit value 404 before bit leveling, where initial sampling point 406 is not properly centered within that portion of DQ having a "0" value 408. The desired final sampling point is shown here as 410. Timing measurement windows Ta 412 and Tb 414 are also shown where Ta is greater than Tb. FIG. 4b shows the timing relationships after bit leveling where DQ has been additionally delayed by a value of (Ta−Tb)/2 from the initial sampling point such that sampling point 410 is now properly aligned to be at the center of that portion of DQ 404 where the data value is a "0". After alignment, Ta equals Tb as shown.

Figure 5:
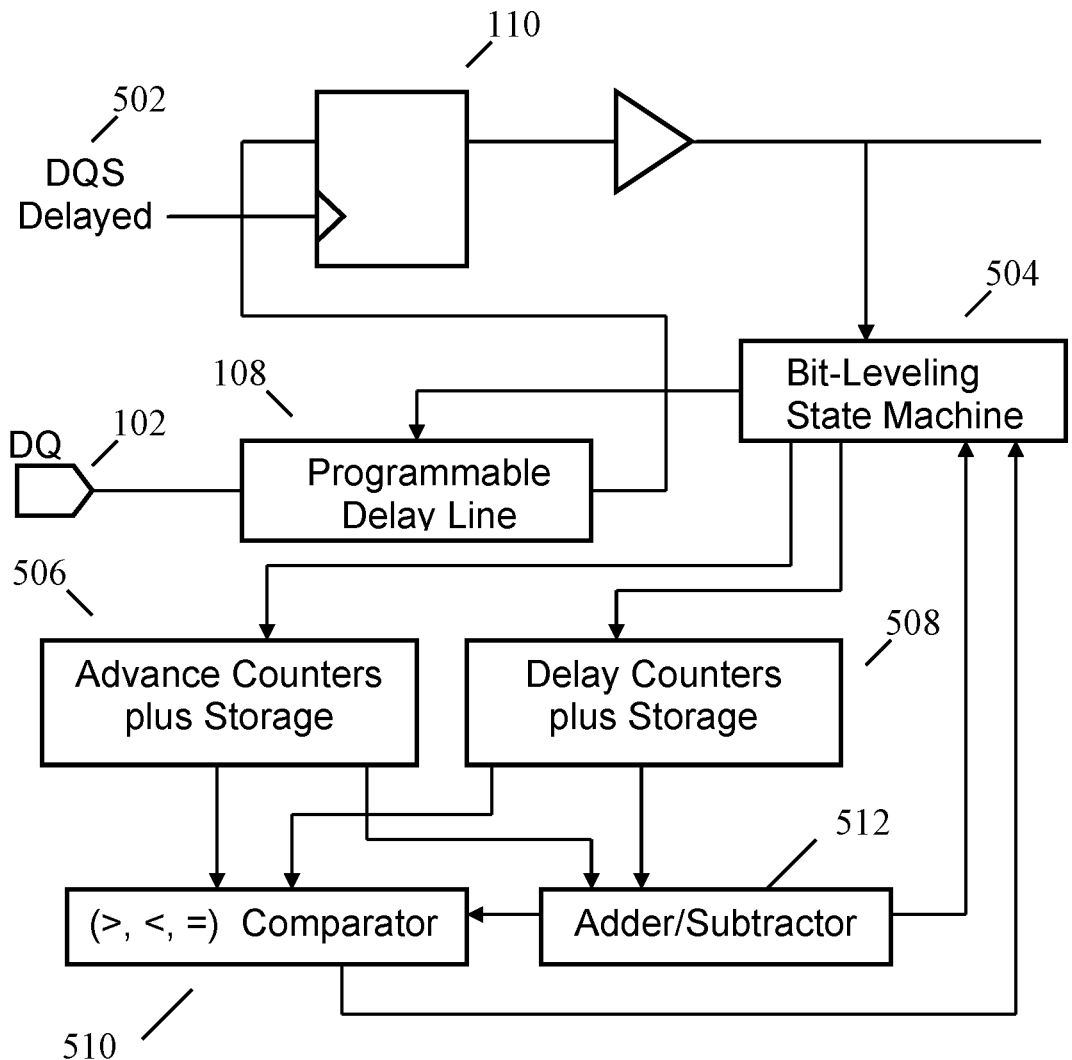
FIG. 5 shows an exemplary and non-limiting circuit block diagram for a generalized bit leveling controller circuit according to the invention.

A generalized circuit block diagram 500 for an exemplary and non-limiting embodiment of a bit leveling invention is shown in FIG. 5. In this example, DQ 102 is delayed in programmable delay line 108 and sampled in flip-flop 110 by a strobe signal, in this case a delayed version 502 of DQS. For this generalized description, a state machine 504 controls bit leveling calibration operations including counters 506 and 508 for advancing and delaying DQ as well as for storing counter values. According to different embodiments of the invention delay measurements may be added or subtracted in block 512, and compared in block 510 to determine "greater than", "less than", or "equal to" results. It should be noted that one skilled in the art could devise many different circuit implementations to implement the functionalities described herein, and that no one particular circuit implementation is defined according to the appended claims. Counters, comparators, and adder/subtractors may be used as described in FIG. 5, however an equivalent functionality could be arrived at by simply having a much larger and more complex version of bit leveling state machine 504.

Figure 12:
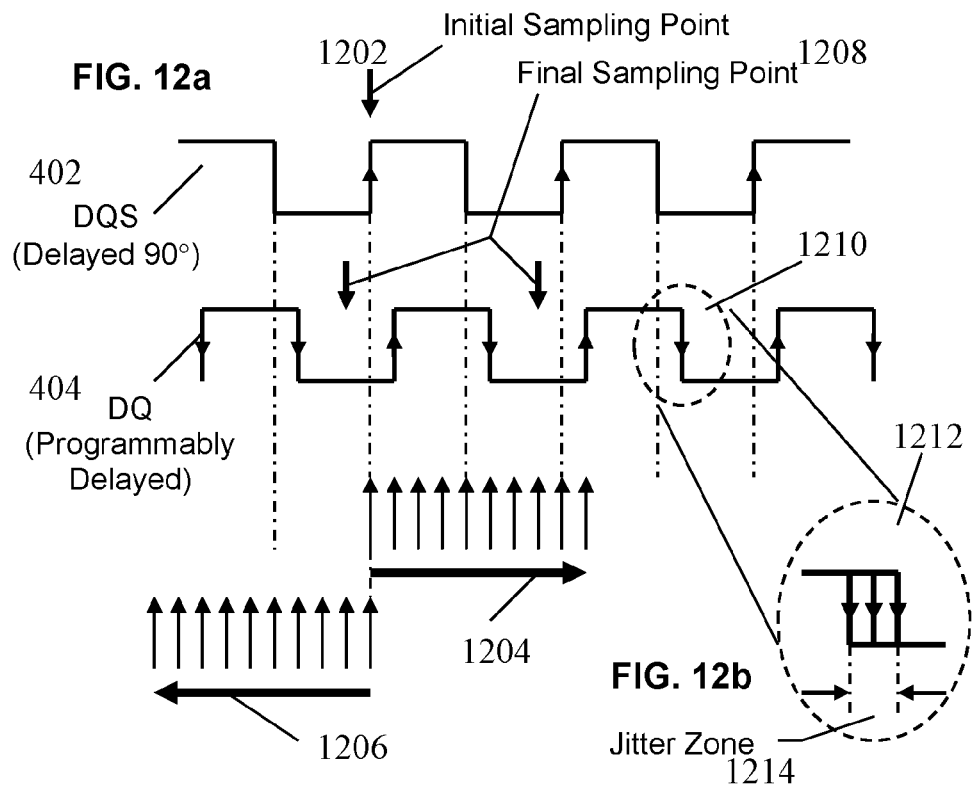
FIG. 12 shows exemplary timing diagrams for two scenarios where a data bit is sampled by incrementally sweeping a sampling point in time, and the results are analyzed to determine the best final sampling point, where
Figure 12:
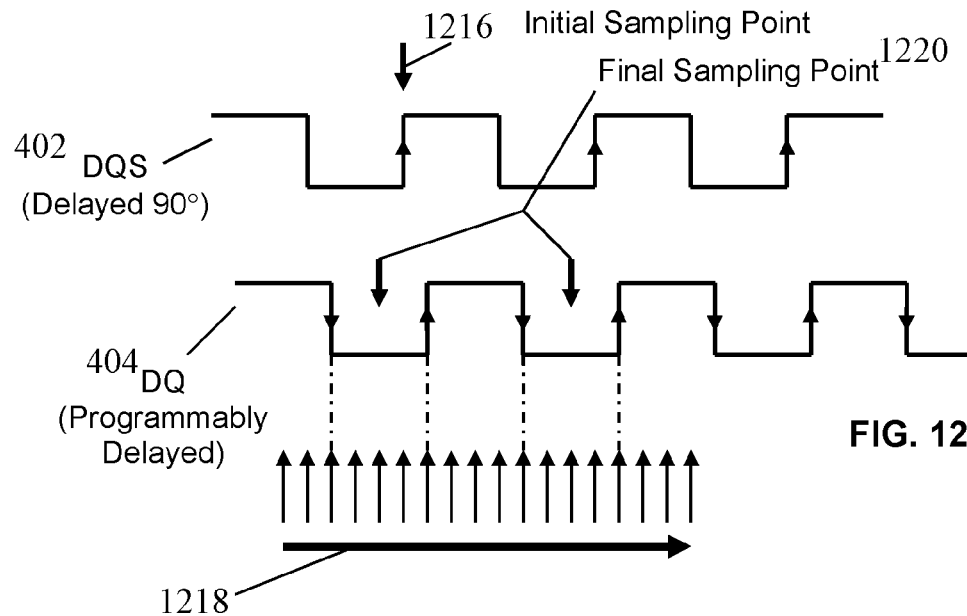
Figure 13:
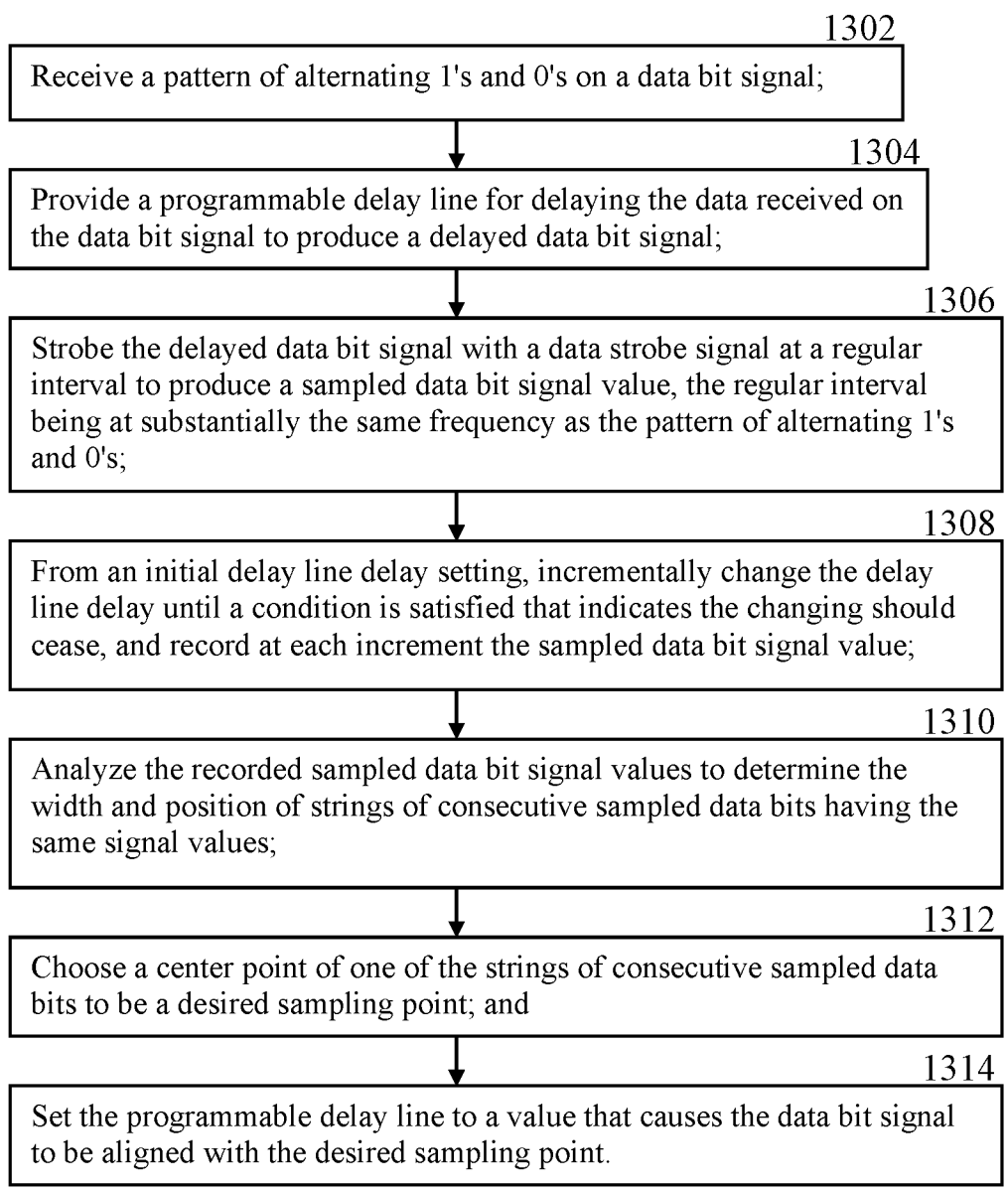
FIG. 13 shows an exemplary flow chart for a generalized scenario where a data bit is sampled by incrementally sweeping a sampling point in time, and the results are analyzed to determine the best final sampling point.

Note that for the alternative embodiment of FIGS. 12 and 13, an implementation of the bit leveling controller circuit may require more storage capability for storing sampled data bit values at different delay increments, and/or for storing more counter values in order to facilitate the analysis process that is performed after and/or during the sweep process.

Figure 6:
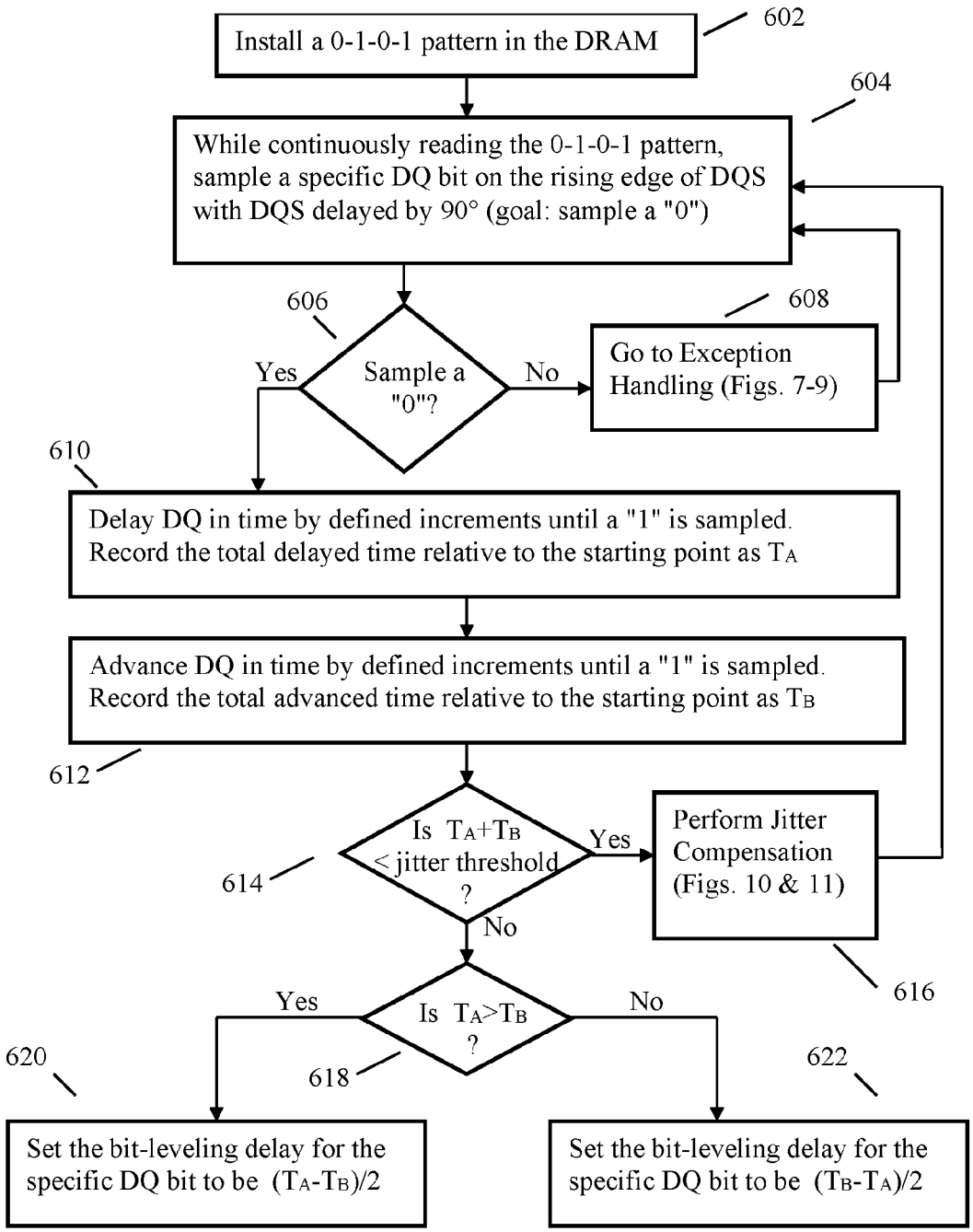
FIG. 6 shows an overall flowchart for an embodiment for bit leveling according to the invention including exception processing when a first sampled data bit is not an expected value, as well as jitter detection and correction.

Flowchart 600 of FIG. 6 shows an overall exemplary flow for an embodiment of the invention, including when exception handling is required and jitter detection and correction are performed. In step 602 a 0-1-0-1 pattern has been installed such that it can be received by a data interface according to the invention during a calibration operation. In this example, such a pattern is installed in a DRAM. According to step 604, while continuously receiving the 0-1-0-1 pattern, a programmably delayed version of a DQ data bit is sampled on the rising edge of DQS—where DQS has been delayed by 90° plus a suitable programmable delay as described previously. It is expected in this scenario that when first sampled, a value of "0" will be sampled at the initial setting of the DQ programmable delay line. In step 606 this determination is made, and if a value of "1" is detected, then exception handling is begun per step 608. During exception handling operations as described in FIGS. 7, 8, and 9, either bit leveling is completed or the process returns to step 604 as shown in FIG. 6.

If a "0" is sampled as expected per 606, the process proceeds to step 610 where DQ is delayed in time by increments from an initial starting point until a "1" is sampled, and the total delay relative to an initial starting point is recorded as Ta. Subsequently per step 612, DQ is advanced in time by increments from the initial starting point until a "1" is sampled, and the total delay relative to the initial starting point is recorded as Tb. Next, jitter detection is performed per step 614 where (Ta+Tb) is compared with a jitter threshold value. If (Ta+Tb) is less than the jitter threshold value, then jitter compensation is performed 616 according to FIGS. 10 and 11, after which the process returns to step 604. Subsequently per step 618, Ta and Tb are compared. Per step 620, if Ta is greater than Tb, bit leveling is achieved by setting the programmable delay line for DQ to be a delay value of (Ta−Tb)/2 from the initial sampling point. If however per step 622, Tb is greater than Ta, bit leveling is achieved by setting the programmable delay line for DQ to be an advance value of (Tb−Ta)/2 from the initial sampling point. If Ta is equal to Tb, then according to the initial delay line setting the strobe is already centered within the data bit value for DQ, and no further adjustment beyond the initial setting of the delay line is required to achieve bit leveling.

Exception Processing

For the exemplary embodiment for data interface as applied to the dynamic memory controller application, it is typically expected that when first sampled at an initial DQ delay line setting, the sample data bit value will be a "0". It is possible however that skews can develop in the system such that initial sampled value is instead a "1". For these circumstances, a similar method as described above is used with some additional steps that provide for a third window measurement in order to position the delayed DQ data bit correctly with respect to sampling strobe DQS.

Figure 7:
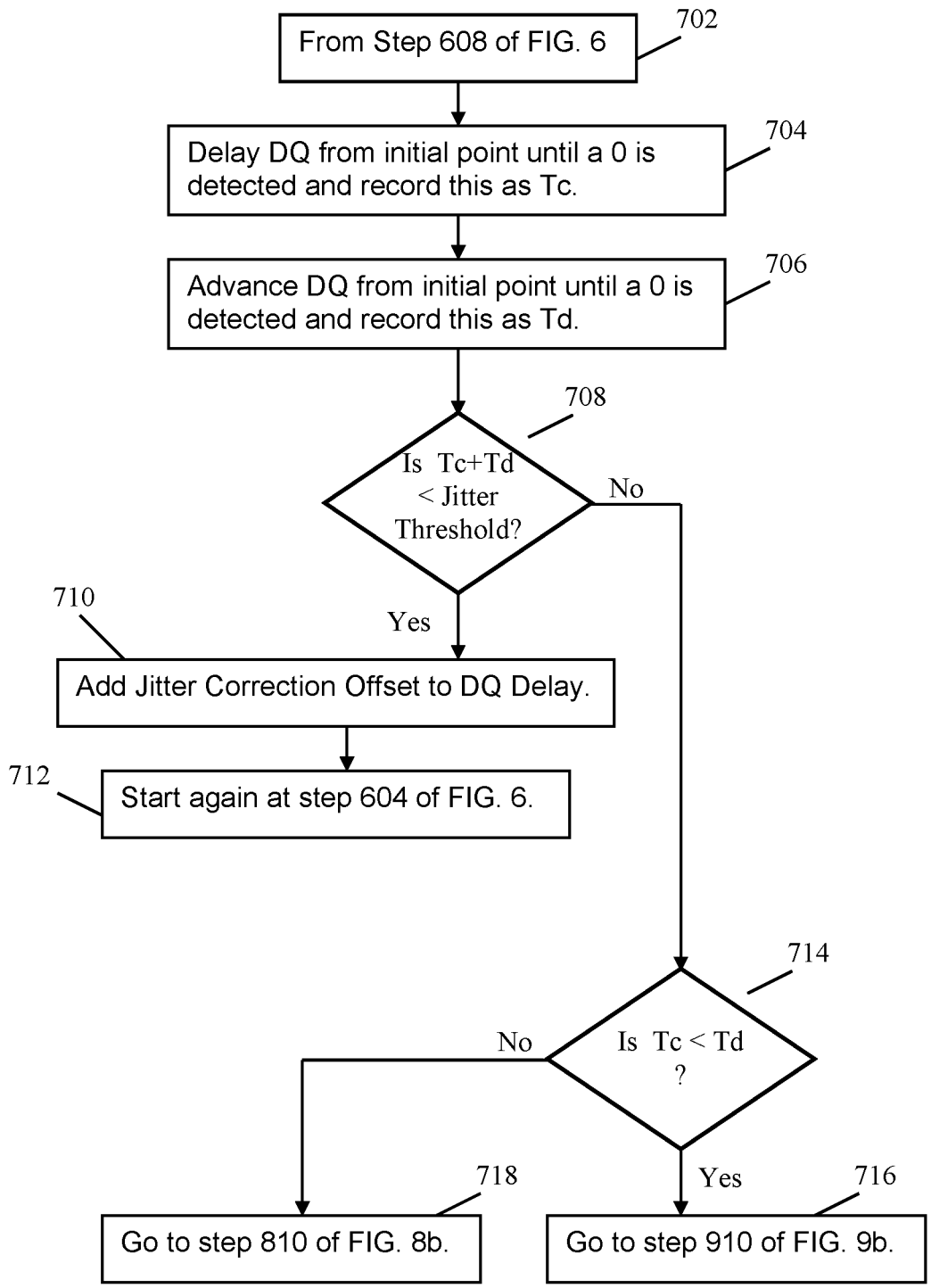
FIG. 7 shows an exemplary flowchart for the first steps in a process for exception processing, also including jitter detection and correction.

A first stage of exception processing is shown in flowchart 700 of FIG. 7 where the process begins in step 702 having been preceded by step 608 of FIG. 6. When a "1" is initially sampled instead of a "0", there are two possible scenarios that may exist—either DQ delay is too high or DQ delay is too small. To determine which might be the case, the following steps are performed by the invention as shown in FIG. 7. First per step 704, DQ is delayed from an initial starting point until a "0" is detected at the sample point, and this delay is recorded as Tc. Then per step 706, DQ is advanced from the initial starting point until a "0" is detected at the sample point, and this delay is recorded as Td. At this point in the exception processing flow, it is appropriate to check for the presence of jitter according to step 708. If the value (Tc+Td) is less than a Jitter Threshold value, then the process proceeds to step 710 for jitter correction where a Jitter Correction Offset value is added to the initial delay line setting, and the process moves 712 to step 604 of FIG. 6 where bit leveling starts again. Note that the appropriate Jitter Threshold value and the Jitter Correction Offset value may vary from implementation to implementation, and proper and effective values will be chosen by the designer who understands all parameters involved in the decision.

If the value (Tc+Td) is not less than a Jitter Threshold value, then it is determined that jitter is not interfering with the bit leveling process and the flow proceeds to step 714 where Tc and Td are compared. If per step 714, Tc is not less than Td, the process proceeds 718 to step 810 of FIG. 8b. If however per step 714, Tc is less than Td, the process proceeds 716 to step 910 of FIG. 9b. FIGS. 8 and 9 show timing diagrams and flow charts for completing the bit leveling process when exception handling is required.

Diagrams and flow charts 800 of FIG. 8 show the completion of bit leveling when Tc 804 is greater than Td 806. In FIG. 8a, delayed DQ data bit 404 is sampled by strobe DQS 402 at an initial sampling point 802 where a "1" is detected which previously had initiated exception processing. In the flowchart of FIG. 8b, the process continues in step 810 as a result of Tc being determined to be greater than Td according to step 716 of FIG. 7. In step 812, DQ is advanced from the initial delay line starting point until a "0" is detected (previously recorded as Td), and then further advanced until a "1" is detected, whereby the delay when the "1" is detected is recorded as Te. Then in step 814, bit leveling is completed by setting the DQ delay line to advance DQ from the initial delay line starting point by a value of (Td+Te)/2, whereby a desired sampling point 808 is achieved. The timing diagram of FIG. 8C shows the timing relationships after bit leveling is completed. Delay value Te 816 is shown along with the final correction whereby DQ is advanced (delay is decremented) by a value equal to (Td+Te)/2 818 relative to the initial delay line starting point value.

Diagrams and flow charts 900 of FIG. 9 show the completion of bit leveling when Tc 904 is less than Td 906. In FIG. 9a, delayed DQ data bit 404 is sampled by strobe DQS 402 at an initial sampling point 902 where a "1" is detected which previously had initiated exception processing. In the flowchart of FIG. 9b, the process continues in step 910 as a result of Tc being determined to be less than Td according to step 718 of FIG. 7. In step 912, DQ is delayed from the initial delay line starting point until a "0" is detected (previously recorded as Tc), and then further delayed until a "1" is detected, whereby the delay when the "1" is detected is recorded as Tf. Then in step 914, bit leveling is completed by setting the DQ delay line to delay DQ from the initial delay line starting point by a value of (Tc+Tf)/2, whereby a desired sampling point 908 is achieved. The timing diagram of FIG. 9C shows the timing relationships after bit leveling is completed. Delay value Tf 916 is shown along with the final correction whereby DQ is delayed (delay is incremented) by a value equal to (Tc+Tf)/2 918 relative to the initial delay line starting point value.

Jitter Detection and Correction

Jitter on the DQS signal, and/or DQ signal, may cause the sampled value of DQ to be taken incorrectly. This may happen when the initial sampling point is near a rising or falling edge of DQ. In the exemplary and non-limiting embodiments that follow for jitter detection and correction, jitter has been shown on the DQS signal and not on the DQ signal. In reality jitter may exist on either signal or both, however to simplify the explanation and the drawings jitter is shown herein only on the DQS signal.

Figure 10:
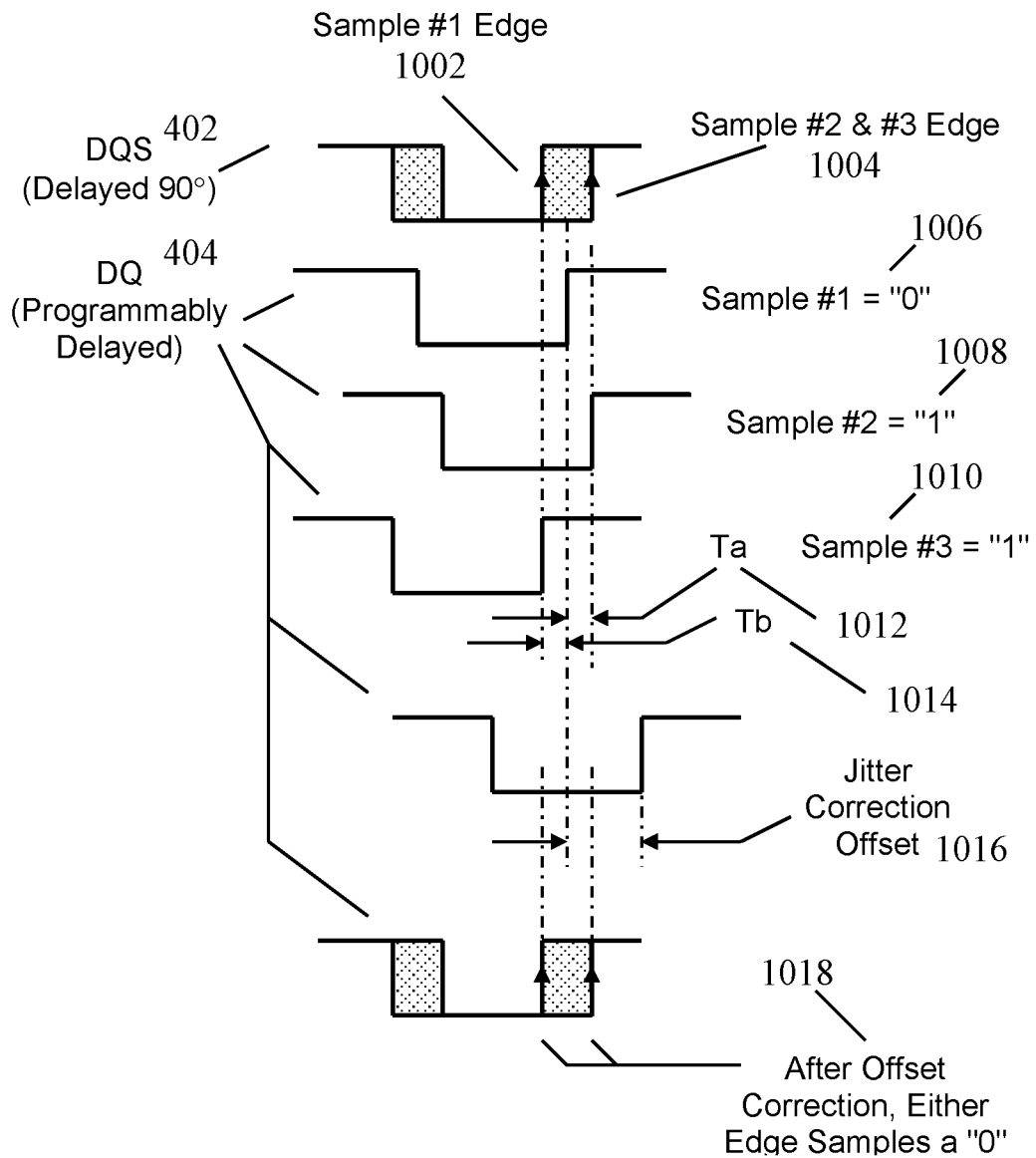
FIG. 10 shows timing diagrams for jitter detection and correction when the sampling point is in the vicinity of a rising edge of the sampled data bit, and jitter is present.
Figure 11:
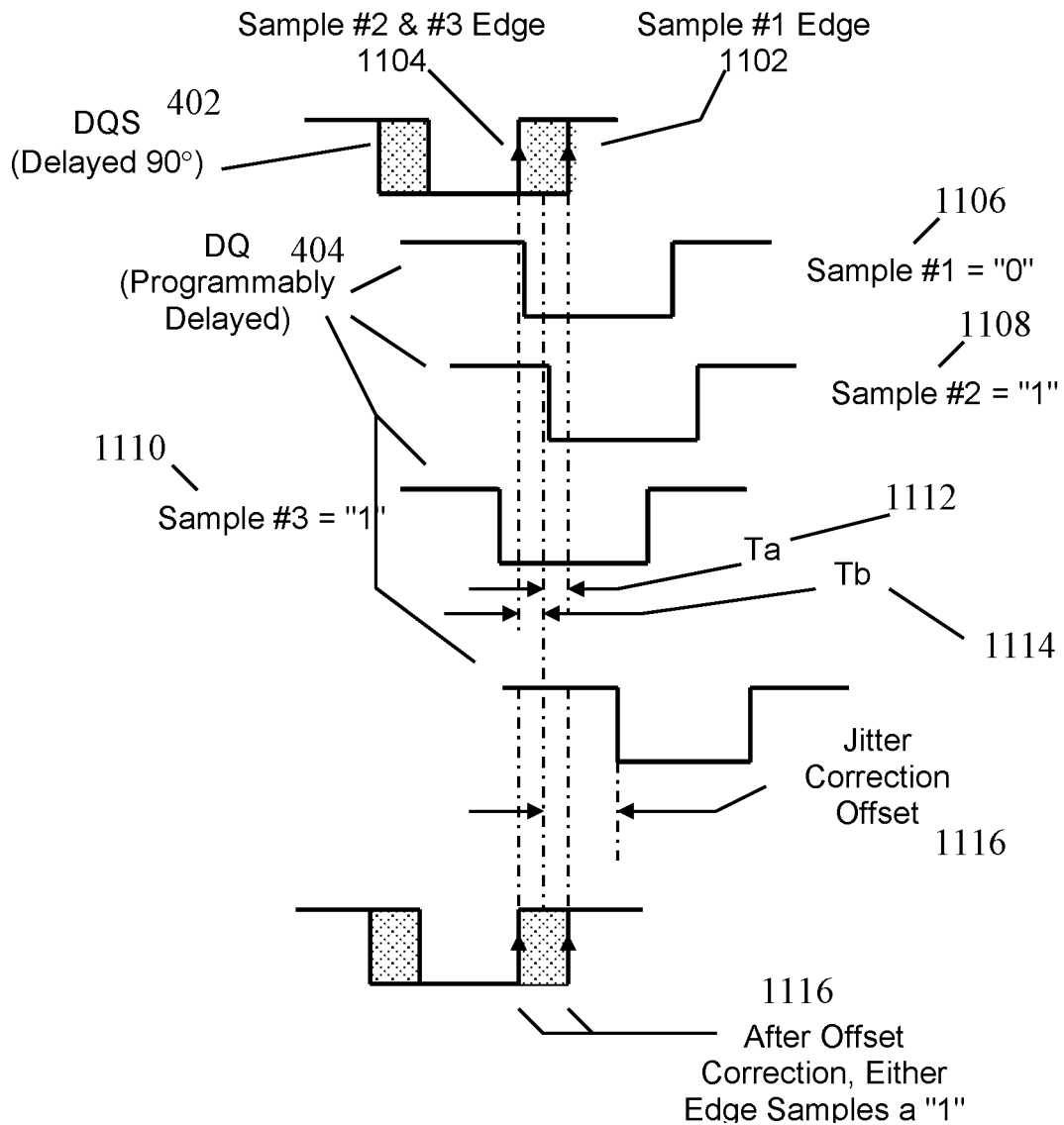
FIG. 11 shows timing diagrams for jitter detection and correction when the sampling point is in the vicinity of a falling edge of the sampled data bit, and jitter is present.

Since a jitter scenario may arise when sampling DQ near either its rising or falling edge, examples are shown for both edges with sampling near the rising edge of DQ shown in FIG. 10 and sampling near the falling edge of DQ shown in FIG. 11. In FIG. 10, the rising edge of the DQS is shown with a jitter region between sample #1 edge 1002 and sample #2 & #3 edge 1004. When the sequence of FIG. 6 is executed and jitter is present, the initial sample, sample #1, may record a "0" 1006. This is the expected value for an initial sample so the procedure of FIG. 6 continues initially as if no jitter is present. Subsequently due to jitter, sample #2 records a "1" 1008 defining Ta 1012. The procedure then continues and again due to jitter the next sample, sample #3, records a "1" 1010 defining Tb 1014. Consequently these measurements determine the size of the (Ta+Tb) window to be very small, or zero, when it should in fact be large, nearly a half cycle. To avoid utilizing this incorrect window value, a value of (Ta+Tb) is compared with a Jitter Correction Threshold value, and if the value (Ta+Tb) is less than this threshold value, a Jitter Correction Offset 1016 is added to the initial sampling point. Subsequently when the bit leveling process is restarted, and assuming a positive jitter correction offset is used to delay DQ from the initial sampling point, either jitter edge of DQS (1002 or 1004) will be positioned such that a "0" value will be detected when DQ is sampled.

Note that if jitter is present and the initial sampling point is near a rising or falling edge of DQ, but however the first sampled value is a "1", then exception processing per FIGS. 7-9 will be initiated and the jitter problem will be resolved through that procedure.

In FIG. 11, the rising edge of the DQS is shown with a jitter region between sample #1 edge 1102 and sample #2 & #3 edge 1104. When the sequence of FIG. 6 is executed and jitter is present, the initial sample, sample #1, may record a "0" 1106. This is the expected value for an initial sample so the procedure of FIG. 6 continues initially as if no jitter is present. Subsequently, due to jitter, sample #2 records a "1" 1108 defining Ta 1112. The procedure then continues and again due to jitter the next sample, sample #3, records a "1" 1110 defining Tb 1114. Consequently these measurements determine the size of the (Ta+Tb) window value to be very small, or zero, when it should in fact be large, nearly a half cycle. To avoid utilizing this incorrect window value, the value (Ta+Tb) is compared with a Jitter Correction Threshold value, and if the value (Ta+Tb) is less than this threshold value, a Jitter Correction Offset 1016 is added to the initial sampling point. Subsequently when the bit leveling process is restarted, and assuming a positive jitter correction offset is used to delay DQ from the initial sampling point, either jitter edge of DQS (1102 or 1104) will be positioned such that a "1" value will be detected when DQ is sampled. The detection of a "1" will initiate the exception processing sequence of FIGS. 7-9 and bit leveling will be thus resolved.

Bit Leveling Via Delay Sweep and Analysis

The methods of the exemplary embodiments described by the methods of FIGS. 6-11 utilize a relatively short delay line for delaying each DQ data bit, with exception processing and jitter detection/correction performed as required. These methods of FIGS. 6-11 also require very little storage circuitry to implement a bit-leveling controller function. An alternative approach is shown in the exemplary and non-limiting embodiments of FIGS. 12 and 13, where the delay value of DQ is swept for a larger number of delay increments, either in two directions per FIG. 12a or in a single direction per FIG. 12c. As shown in FIG. 12a, an initial sampling point might be timed to sample a "0" on DQ 404, however for the operational methods for the embodiments of FIGS. 12 and 13, it doesn't matter whether the initial sampled value for DQ is a "0" or a "1". As shown in FIG. 12a, DQ is first delayed from an initial position by number of increments which are swept as shown by sequence 1204, and then subsequently swept in the opposite direction (advanced) by a number of increments shown as sequence 1206. Each of these sweeps may continue for a predetermined number of delay line increments, or may continue until the end of the delay line is reached or until some other condition is satisfied. In one exemplary and non-limiting embodiment, at each increment the value of DQ that is sampled is recorded. Subsequently after sweeps 1204 and 1206 have been completed, the recorded values of DQ for each delay line increments are analyzed to determine an optimum final sampling point 1208. In an alternative implementation for the embodiment of FIGS. 12 and 13, at least a portion of the analysis of the strings of sampled data bits is performed while the sweep of the delay line is executed, thereby requiring fewer data and counter values to be saved along the way for post-sweep analysis. For instance, only delay line increments where a sampled data bit value changes relative to its value at the previous delay line increment would be stored. In yet another alternative embodiment for a sweep-based controller function, to avoid storing counter values a string of data bit values can be stored in successive memory or register locations within the bit-leveling controller circuit, with each location corresponding to an increment of the sweep. Then after the sweep is complete, these locations can be analyzed with the understanding that each successive bit location represents the data bit value at the next delay line increment. For all embodiments of a sweep-based methodology, the optimum sampling point is determined by locating consecutive strings of sampled data bits having the same value, typically a "0", and placing the final sampling point 1208 in the center of one of these consecutive strings.

For embodiments per FIGS. 12 and 13, jitter is resolved in a different manner than described in FIGS. 10 and 11. When jitter occurs it becomes evident at the rising and falling edges of DQ such as falling edge 1210 shown for example in the enlarged diagram 1212 of FIG. 12b where jitter zone 1214 is highlighted. According to an analysis method used with the sweep methodologies of FIGS. 12 and 13, when sweeping through a jitter zone sampled data values on successive samples may be different, and thus can be differentiated from a successive string of sample data bits having the same value, and where the string of sampled data values has a width of an appropriate size. Therefore in analyzing successive strings of sampled data bits having the same value, to be considered for placement of a final sampling point, a string of sample data bits having the same value must have a width greater than a jitter threshold value.

The diagram of FIG. 12c shows initial sampling point 1216 and describes a scenario where a single sweep 1218 is performed from one delay position of the DQ delay line to another delay position of the DQ delay line. These positions may be the extreme settings of the delay line, or arbitrary start and finish positions as determined by the application. As described above for FIG. 12a, sampled data bits may be recorded for every increment while the sweep is performed, and successive strings of data bits having a "0" value are considered for possible placement of the final sampling point 1220. Jitter is resolved in the same manner described above for FIG. 12a. Alternately, at least a portion of the analysis of the strings of sampled data bits may be performed while the sweep of the delay line is executed, thereby requiring fewer data and counter values to be saved along the way for post-sweep analysis.

Flowchart 1300 of FIG. 13 shows a generalized description of a process encompassing the embodiments of FIG. 12. In step 1302, a pattern of alternating "1"s and "0"s is received on a data bits signal, nominally DQ of FIGS. 12a and 12c. In step 1304 a programmable delay line is provided for delaying data received on the data bit signal, typically DQ for a dynamic memory interface, and a delayed data bit signal is produced. In step 1306 the delayed data bit signal is strobed by a data strobe signal, nominally a delayed version of DQS for dynamic memory interfaces. Strobing is performed at a regular interval to produce a sampled data bit signal value. The regular interval is typically at substantially the same frequency as the pattern of alternating "1"s and "0"s. In step 1308, from an initial delay setting for the delay line that delays the data bit (DQ), the delay line delays are incrementally changed or swept until a condition is satisfied that indicates the changing should cease. This condition could be that a predetermined point along the delay line has been reached, or that the end of the delay line has been reached, or some other termination condition determined according to a specific application. As the delay line is swept, at each increment the sampled data bits signal is recorded. Alternately, at least a portion of the analysis of the strings of sampled data bits is performed while the sweep of the delay line is executed, thereby requiring fewer data bit and counter values to be saved along the way for post-sweep analysis.

In step 1310 the recorded sampled data bit signal values are analyzed in order to determine the width and position of strings of consecutive sample data bits having the same signal values. Note that Steps 1308 and 1310 can be combined in an alternative implementation such that at least a portion of the analysis of the strings of sampled data bits is performed while the sweep of the delay line is executed, thereby requiring fewer data and counter values to be saved along the way for post-sweep analysis.

In step 1312 a center point of one of the strings of consecutive sample data bits is chosen to be a desired sampling point. In step 1314 the programmable delay line for the data bit is set to a value that causes the data strobe signal to be aligned with the desired sampling point. If jitter is present, jitter is resolved by only considering consecutive strings of sampled data bits having the same value where the length of the string is greater than a jitter detection threshold.

At this point in the method of FIG. 13, bit leveling has been completed for a particular data bit. Typically, a similar bit leveling capability is included for each data bit where system timing skews can affect the reliability of the data interface in question. This requires a reasonable amount of circuitry and if silicon real estate is an issue, bit leveling could be performed on a byte or nibble basis where a delay setting for one data bit of a byte or nibble is utilized for the other bits. On the other hand, if silicon real estate is not an issue, bit leveling capabilities such as those described herein can be utilized for sampling data bits on the negative edge of a sampling strobe such as DQS in addition to the positive edge as focused on herein.

Thus, a circuit and operating method for adaptive bit-leveling for data interfaces has been described.

It should be appreciated by a person skilled in the art that methods, processes and systems described herein can be implemented in software, hardware, firmware, or any combination thereof. The implementation may include the use of a computer system having a processor and a memory under the control of the processor, the memory storing instructions adapted to enable the processor to carry out operations as described hereinabove. The implementation may be realized, in a concrete manner, as a computer program product that includes a non-transient and tangible computer readable medium holding instructions adapted to enable a computer system to perform the operations as described above.

The invention claimed is:

1. A bit-leveling circuit for performing bit-leveling for a data interface including operating first and second calibration processes, the circuit comprising at least:
a circuit for providing a data strobe signal;
a circuit for receiving a data bit signal, including a programmable delay line for delaying the received data bit signal to provide a delayed data bit signal;
at least one flip-flop for sampling the delayed data bit signal;
a bit-leveling controller circuit responsive to the sampled delayed data bit signal and for controlling the delay of the programmable delay line;
wherein the bit leveling circuit:
receives a known pattern of 1's and 0's on the data bit signal, and
strobes the delayed data bit signal with the data strobe signal to produce the sampled delayed data bit signal, wherein strobing the delayed data bit signal is synchronized with the known pattern of 1's and 0's;
wherein operation of the bit leveling circuit includes performing the first calibration process comprising:
incrementally increasing the delay line delay, until a value of the sampled delayed data bit signal changes, and storing a number of increments necessary to reach a point where the sampled delayed data bit signal changed relative to its value at an initial delay line delay setting as value Ta;
incrementally decreasing the delay line delay, until a value of the sampled delayed data bit signal changes, and storing a number of increments necessary to reach a point where the sampled delayed data bit signal changed relative to its value at the initial delay line delay setting as value Tb; and
determining a sum of Ta and Tb;
wherein if the sum of Ta and Tb is less than a pre-determined jitter detection threshold value, the bit leveling circuit performs the second calibration process comprising:
setting the delay line delay to the initial setting value plus a jitter correction offset delay value to create a revised initial delay line delay setting;
from the revised initial delay line delay setting, incrementally increasing the delay line delay until a value of the sampled delayed data bit signal changes, and storing a number of increments necessary to reach a point where the sampled delayed data bit signal changed relative to its value at the revised initial delay line delay setting as value Ta;
from the revised initial delay line delay setting, incrementally decreasing the delay line delay until a value of the sampled delayed data bit signal changes, and storing a number of increments necessary to reach a point where the sampled delayed data bit signal changed relative to its value at the revised initial delay line delay setting as value Tb; and
as a function of Ta and Tb, adjusting the delay line setting to advance or delay the data bit signal, such that the delayed data bit signal is sampled at the midpoint of a half-cycle of the delayed data bit signal.

2. The circuit of claim 1 wherein the known pattern of 1's and 0's on the data bit signal comprises an alternating pattern of 1's and 0's.

3. The circuit of claim 1, wherein operation of the bit leveling circuit further comprises:
comparing Ta and Tb, and wherein if Ta is greater than Tb, setting the delay line delay to a value equal to the initial delay line delay with an addition of an averaging factor wherein the averaging factor is (Ta−Tb)/2.

4. The circuit of claim 1, wherein operation of the bit leveling circuit further comprises:
comparing Ta and Tb, and wherein if Ta is less than Tb, setting the delay line delay to a value equal to the initial delay line delay decremented by an averaging factor wherein the averaging factor is (Tb−Ta)/2.

5. The circuit of claim 1 wherein incrementally increasing and decreasing the delay line delay comprises changing the delay line delay by time increments that are each less than a period of the known pattern of 1's and 0's.

6. A bit-leveling circuit for performing bit-leveling for a data interface including operating at least first and second calibration processes, the circuit comprising at least:
a circuit for providing a data strobe signal;

a circuit for receiving a data bit signal, including a programmable delay line for delaying the received data bit signal to provide a delayed data bit signal;
at least one flip-flop for sampling the delayed data bit signal;
a bit-leveling controller circuit responsive to the sampled delayed data bit signal and for controlling the delay of the programmable delay line;
wherein the bit leveling circuit:
  receives a known pattern of 1's and 0's on the data bit signal, and
  samples the delayed data bit signal with the data strobe signal to produce the sampled delayed data bit signal, wherein strobing the data bit signal is synchronized with the known pattern of 1's and 0's;
wherein if the sampled delayed data bit signal does not differ from an expected value when first sampled from the known pattern of 1's and 0's, then the bit-leveling circuit proceeds with the first calibration process, comprising:
  from an initial delay line delay setting, incrementally increasing the delay line delay until the value of the sampled delayed data bit signal changes, and storing a number of increments necessary to reach a point where the sampled delayed data bit signal changed relative to its value at the initial delay line delay setting as value Tc;
  from the initial delay line delay setting, incrementally decreasing the delay line delay until the value of the sampled delayed data bit signal changes, and storing a number of increments necessary to reach a point where the sampled delayed data bit signal changed relative to its value at the initial delay line delay setting as value Td;
summing Tc and Td;
if (Tc+Td) is less than a pre-determined jitter detection threshold value, the bit-leveling circuit performs the second calibration process comprising:
  setting the delay line delay to the initial setting value plus a jitter correction offset delay value to create a revised initial delay line delay setting;
  from the revised initial delay line delay setting, incrementally increasing the delay line delay until the value of the sampled delayed data bit signal changes, and storing a number of increments necessary to reach a point where the sampled delayed data bit signal changed relative to its value at the revised initial delay line delay setting as value Ta;
  from the revised initial delay line delay setting, incrementally decreasing the delay line delay until the value of the sampled delayed data bit signal changes, and storing a number of increments necessary to reach a point where the sampled delayed data bit signal changed relative to its value at the revised initial delay line delay setting as value Tb; and
  as a function of Ta and Tb, adjusting the delay line setting to advance or delay the data bit signal, such that the delayed data bit signal is sampled at a midpoint of a half-cycle of the delayed data bit signal.

7. The circuit of claim 6 wherein the known pattern of 1's and 0's on the data bit signal comprises an alternating pattern of 1's and 0's.

8. The circuit of claim 6, wherein if the sampled delayed data bit signal when first sampled differs from an expected value of 0, the bit-leveling circuit executes a third calibration process comprising the sequential steps of:
  comparing the values of Tc and Td, wherein if the value Tc is greater than Td, incrementally changing the delay line delay to advance the delayed data bit signal from the initial point until a 0 is detected, the increment for the detected 0 having been previously recorded as Td, and then further advancing the delayed data bit signal until a 1 is detected, whereby the delay line delay is recorded as Te; and
  setting the delay line delay to advance the delayed data bit signal from the initial point by a value equal to (Td+Te)/2.

9. The circuit of claim 6, wherein if the sampled delayed data bit signal when first sampled differs from an expected value of 0, the bit-leveling circuit continues with a third calibration process comprising the sequential steps of:
  comparing the values of Tc and Td, wherein if the value Tc is less than Td, incrementally changing the delay line delay to delay the delayed data bit signal from the initial point until a 0 is detected, the increment for the detected 0 having been previously recorded as Tc, and then further delaying the delayed data bit signal until a 1 is detected, whereby the delay line delay is recorded as Tf; and
  setting the delay line delay to delay the delayed data bit signal from the initial point by a value equal to (Tc+Tf)/2.

10. The circuit of claim 6, wherein if the sampled delayed data bit signal when first sampled differs from an expected value of 1, the bit-leveling circuit continues with a third calibration process comprising the sequential steps of:
  comparing the values of Tc and Td, wherein if the value Tc is greater than Td, incrementally changing the delay line delay to advance the delayed data bit signal from the initial point until a 1 is detected, the increment for the detected 1 having been previously recorded as Td, and then further advancing the delayed data bit signal until a 0 is detected, whereby the delay line delay is recorded as Te; and
  setting the delay line delay to advance the delayed data bit signal from the initial point by a value equal to (Td+Te)/2.

11. The circuit of claim 6, wherein if the sampled delayed data bit signal when first sampled differs from an expected value of 1, the bit-levelling circuit continues with a third calibration process comprising the sequential steps of:
  comparing the values of Tc and Td, wherein if the value Tc is less than Td, incrementally changing the delay line delay to delay the delayed data bit signal from the initial point until a 1 is detected, the increment for the detected 1 having been previously recorded as Tc, and then further delaying the delayed data bit signal until a 0 is detected, whereby the delay line delay is recorded as Tf; and
  setting the delay line delay to delay the delayed data bit signal from the initial point by a value equal to (Tc+Tf)/2.

12. The circuit of claim 6 wherein incrementally increasing and decreasing the delay line delay comprises changing the delay line delay by time increments that are each less than a period of the known pattern of 1's and 0's.

* * * * *